(12) United States Patent
Kwon et al.

(10) Patent No.: US 7,706,206 B2
(45) Date of Patent: Apr. 27, 2010

(54) SEMICONDUCTOR INTEGRATED CIRCUIT

(75) Inventors: Tae Heui Kwon, Ichon (KR); Jae Boum Park, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/959,358

(22) Filed: Dec. 18, 2007

(65) Prior Publication Data

US 2008/0279031 A1 Nov. 13, 2008

(30) Foreign Application Priority Data

May 10, 2007 (KR) .................. 10-2007-0045452

(51) Int. Cl.
*G11C 7/00* (2006.01)
(52) U.S. Cl. .................. 365/227; 365/189.05
(58) Field of Classification Search .................. 365/227, 365/189.05
See application file for complete search history.

(56) References Cited

U.S. PATENT DOCUMENTS

| 5,483,486 | A | * | 1/1996 | Javanifard et al. ...... 365/185.17 |
| 5,912,899 | A | | 6/1999 | Kim et al. |
| 5,926,434 | A | * | 7/1999 | Mori ..................... 365/233.14 |
| 6,489,819 | B1 | * | 12/2002 | Kono et al. .................. 327/141 |
| 7,106,617 | B2 | * | 9/2006 | Jeon et al. .................... 365/145 |
| 7,298,664 | B2 | * | 11/2007 | Lee ............................. 365/229 |
| 2003/0042957 | A1 | * | 3/2003 | Tamura ..................... 327/233 |
| 2003/0214345 | A1 | * | 11/2003 | Yamauchi et al. ........... 327/530 |
| 2004/0001386 | A1 | * | 1/2004 | Park ........................... 365/227 |
| 2004/0027866 | A1 | * | 2/2004 | Pekny .................. 365/189.09 |
| 2007/0008802 | A1 | * | 1/2007 | Joo et al. .................... 365/226 |
| 2007/0013420 | A1 | * | 1/2007 | Jin ............................. 327/158 |

FOREIGN PATENT DOCUMENTS

| JP | 11-144461 | 5/1999 |
| JP | 11-238399 | 8/1999 |
| JP | 2001-014845 | 1/2001 |
| JP | 2002-246891 | 8/2002 |
| JP | 2004-253072 | 9/2004 |
| KR | 1020020034219 | 5/2002 |
| KR | 100482737 | 4/2005 |
| KR | 100668750 | 1/2007 |

* cited by examiner

*Primary Examiner*—Michael T Tran
(74) *Attorney, Agent, or Firm*—Baker & McKenzie LLP

(57) ABSTRACT

A semiconductor integrated circuit includes a first buffer and a second buffer having different operational timing, a first voltage power supply for generating a first power supply voltage supplied to the first buffer in accordance with the operational timing of the first buffer, and a second voltage power supply for generating a second power supply voltage supplied to the second buffer in accordance with the operational timing of the second buffer.

20 Claims, 6 Drawing Sheets

FIG.1

| KIND OF INPUT BUFFER | TIMING OF TURN-ON OF BUFFER | BUFFER SOURCE POWER SOURCE |
|---|---|---|
| CLOCK BUFFER | ALWAYS TURNED ON EXCLUDING SELF REFRESH MODE | Int_v |
| CLOCK ENABLE BUFFER | ALWAYS TURNED ON | Int_v |
| ADDRESS BUFFER | ALWAYS TURNED ON EXCLUDING POWER DOWN MODE | Int_v |
| DATA BUFFER | ALWAYS TURNED ON EXCLUDING READ/PRECHARE OPERATIONS | Int_v |

[KIND OF INPUT BUFFERS AND TIMING OF TURN-ON OF BUFFER]

FIG.2

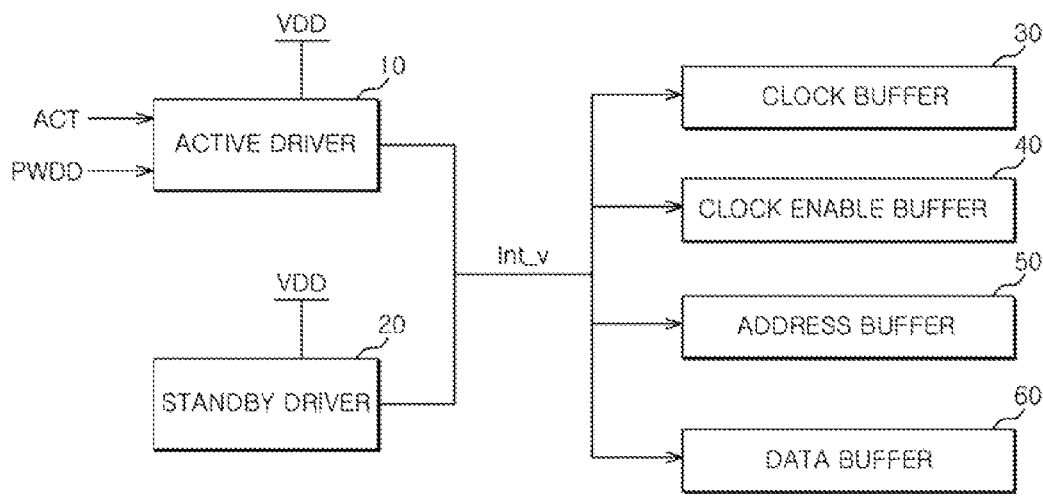

SEMICONDUCTOR INTEGRATED CIRCUIT

CROSS-REFERENCES TO RELATED APPLICATION

The present application claims priority under 35 U.S.C. 119(a) to Korean application number 10-2007-0045452, filed on May 10, 2007, in the Korean Patent Office, which is incorporated by reference in its entirety as if set forth in full.

BACKGROUND

1. Technical Field

The embodiments described herein relate to a semiconductor integrated circuit and, more particularly, to apparatus and methods for effectively supplying a power source to input buffers in a semiconductor integrated circuit.

2. Related Art

Generally, in a CMOS semiconductor integrated circuit, a clock signal, a clock enable signal, data inputs, an address signal, and a command input from an external system must be input to input buffers of a semiconductor integrated circuit to be converted to a CMOS voltage level. Conventional input buffers include a clock buffer, a clock enable buffer, a data buffer, and an address buffer. The operational timing of the clock buffer, the clock enable buffer, the data buffer, and the address buffer are illustrated in FIG. 1.

Referring to FIG. 1, it can be seen that a clock buffer receives and buffers a clock signal and is always turned on excluding the case where the clock buffer performs a self-refresh operation. In the case of a self-refresh operation, the clock buffer is not controlled by an external command but performs active and precharging operations at a predetermined interval using an internal counter, during which the clock buffer is not driven.

A clock enable buffer buffers the clock enable signal, except for in a power-down mode, and is always turned on.

An address buffer receives the address signal and is always turned on excluding the case where the address buffer is in the power-down mode. The address buffer is turned off in the power-down mode since the address is not received from an external circuit during power down mode.

The data buffer buffers a data signal, is turned on during a write operation, and is turned off in the other operation modes. This is because the data signal is only received when a write operation is performed.

In a double data rate synchronous dynamic random access memory (DDR SDRAM), a write latency exists. Accordingly, the data buffer is turned on in the write operation. However, the write latency does not exist in a single data rate synchronous dynamic random access memory (SDR SDRAM), where the data must be immediately received when a write command is received, and therefore the data buffer must be driven before the write operation. Accordingly, in the case of the SDR SDRAM, the data buffer is turned on in all modes, except the read and precharge modes.

In conventional semiconductor integrated circuits, the same source power Int_v (hereinafter, referred to as a power supply voltage) is provided to the clock buffer, the clock enable buffer, the address buffer, and the data buffer. The power supply voltage Int_v is a buffer-exclusive power source obtained by down-converting an external voltage into an internal power voltage through a common internal voltage generating circuit. As described above, the input buffers are turned on and off at various, differing times. This is done in part to reduce unnecessary power consumption.

FIG. 2 is a diagram, illustrating a conventional semiconductor integrated circuit that includes a power supply voltage generating block and an input buffer block. The power supply voltage generating block includes an active driver 10 and a standby driver 20.

The active driver 10 is turned on in an active mode and is turned off in the precharge mode as well as in the power-down mode.

The standby driver 20 is always driven regardless of operation modes. That is, since the standby driver 20 must continuously provide the power supply voltage Int_v to the input buffers, the standby driver 20 must always be on. On the other hand, the active driver 10 is driven only in the active mode to additionally supply the power supply voltage Int_v to the input buffers to compensate for any insufficient supply of power caused by current consumption during the active mode.

The input buffers include the clock buffer 30, the clock enable buffer 40, the address buffer 50, and the data buffer 60. The input buffers receive the power supply voltage Int_v from the active driver 10 and the standby driver 20 and use it to buffer signals input to the input buffers.

The data buffer 60 is turned on only during a write operation and the other input buffers are always turned on excluding the case where they are in the power-down mode. Therefore, since the timing of operation of the data buffer 60 is different from that of the other input buffers, the operation timing interval in which the current consumption is generated by the power source of the data buffer 60 is different from the operation timing interval in which the current consumption is generated by the power sources of the other input buffers.

In addition, in a conventional layout, the input buffers are arranged by kind in various regions of the layout. Accordingly, different types of buffers can be located in separate regions, e.g., the data buffer and the address buffer, or the data buffer and the clock buffer, may be arranged in different regions that are separated from each other by a predetermined distance. Therefore, in order to supply the power supply voltage Int_v to the different input buffers, the length of a power line for transmitting the power supply voltage Int_v can increase for certain buffers relative to certain other buffers.

The increased length will increase the capacitance and resistance of the power line, which means that the supply of power to an input buffer farther away from the power supply voltage Int_v may be delayed and the voltage supplied may be reduced. In addition, the efficiency of the current supply to an associated power supply voltage driver may deteriorate in accordance with the position of each input buffer. That is, in order to ensure an effective current supply for each buffer, it is necessary that a power supply voltage driver be additionally provided in each region where each buffer is positioned.

Furthermore, although the data buffer 60 operates only in the write operation, when the data buffer is driven, the active driver and the standby driver are both driven during other operational modes. Thus, e.g., the active driver is also driven when the data buffer is not driven. Therefore, the operational current of the active driver 10 is greater than that of the standby driver. When the external supply voltage VDD increases, the operational current can reach several mA, which can result in excessive current consumption.

SUMMARY

A semiconductor integrated circuit for controlling a power supply voltage supplied to each input buffer so as to reduce power consumption and to effectively use a power supply voltage are described herein.

According to one aspect, there is provided a semiconductor integrated circuit comprising a first buffer and a second buffer having different operational timing, a first voltage power supply for generating a first power supply voltage supplied to the first buffer in accordance with the operational timing of the first buffer, and a second voltage power supply for generating a second power supply voltage supplied to the second buffer in accordance with the operational timing of the second buffer.

According to another aspect, there is provided a semiconductor integrated circuit comprising a write-on driver for generating a first power supply voltage in response to a write enable signal and a data buffer that receives the first power supply voltage to buffer input data.

According to still another aspect, there is provided a semiconductor integrated circuit comprising a non power-down driver for generating a first power supply voltage in response to a power-down mode signal and an input buffer that receives the first power supply voltage.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 1 is a view illustrating exemplary input buffers and the turn-on time thereof;

FIG. 2 is a block diagram illustrating a exemplary power supply voltage generating circuit and exemplary input buffers;

DETAILED DESCRIPTION

Figure 3:
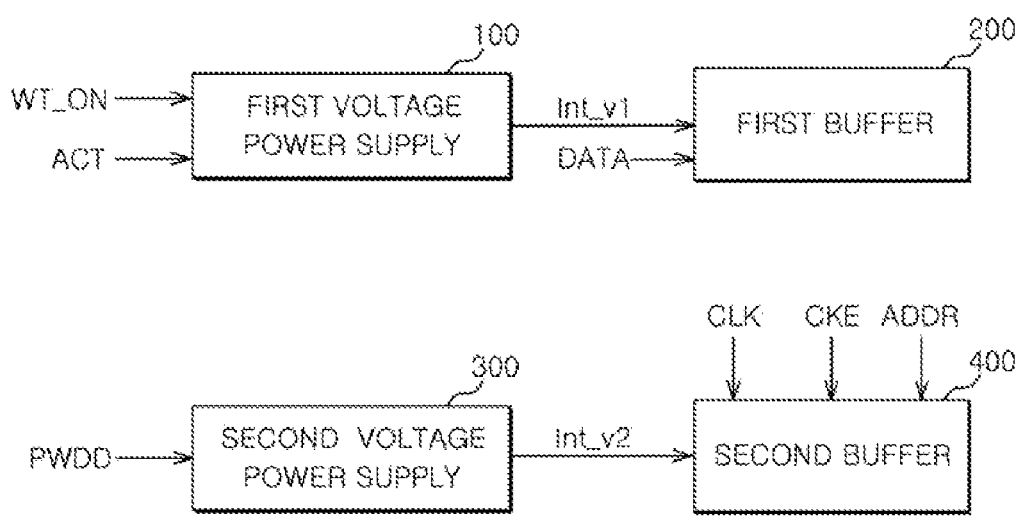
FIG. 3 is a block diagram illustrating a semiconductor integrated circuit according to one embodiment.

FIG. 3 is diagram illustrating an example power supply voltage generating circuit 50 in accordance with one embodiment. Referring to FIG. 3, it can be seen that the power supply voltage generating circuit 50 can include a first voltage power supply 100, a second voltage power supply 300, a first buffer 200, and a second buffer 400.

The operational timing of the first buffer 200 can be different from the operational timing of the second buffer 400. For example, the first buffer 200, which can, e.g., be a data buffer, can be driven only during a write operation, while the second buffer 400, which can, e.g., be a clock buffer, a clock enable buffer, or an address buffer, can always turned on.

The first voltage power supply 100 can be configured to generate a first power supply voltage Int_v1 supplied to the first buffer 200 in accordance with the operational timing of the first buffer 200. The second voltage power supply 300 can be configured to generate a second power supply voltage Int_v2 supplied to the second buffer 400 in accordance with the operational timing of the second buffer 400.

For example, the first voltage power supply 100 can be configured to generate the first power supply voltage Int_v1 in response to a write enable signal (WT_ON) and an active signal (ACT). The write enable signal (WT_ON) can be a signal that is enabled during a write operation. The active signal (ACT) can be a signal that is enabled in an active mode.

The data buffer 200 can then be turned on at the time of the write operation for a DDR SDRAM, or before the write operation for a SDR SDRAM. Whereas the input buffer 400 is always turned, other than in the power-down mode.

Accordingly, the data buffer 200 and the input buffer 400 are turned on at different times. Therefore, in order to supply a power supply voltage to each buffer when each buffer is turned on, i.e., in accordance with the operational timing of each buffer, the first and second voltage power supplies are driven according to the operational timing of the buffers. For example, the first voltage power supply 100 can be driven, and the first power supply voltage Int_v1 supplied to the data buffer 200 during a write operation or during the active mode as dictated by the write enable signal (WT_ON) and the active signal (ACT). The second voltage power supply 300 can, e.g., be driven, and the second power supply voltage Int_v2 supplied to the input buffer 400 in a non power-down mode, e.g., any mode in which the buffer is active as dictated by power down signal (PWDD). As a result of this selective activation and driving of the first and second voltage power supplies 100 and 300, current consumption can be reduced.

Depending on the embodiment, the magnitude of the first power supply voltage Int_v1 can be the same or different from that of the second power supply voltage Int_v2. In the example of FIG. 3, it can be assumed that the magnitude of the first power supply voltage Int_v1 is the same as the magnitude of the second power supply voltage Int_v2.

Figure 4:
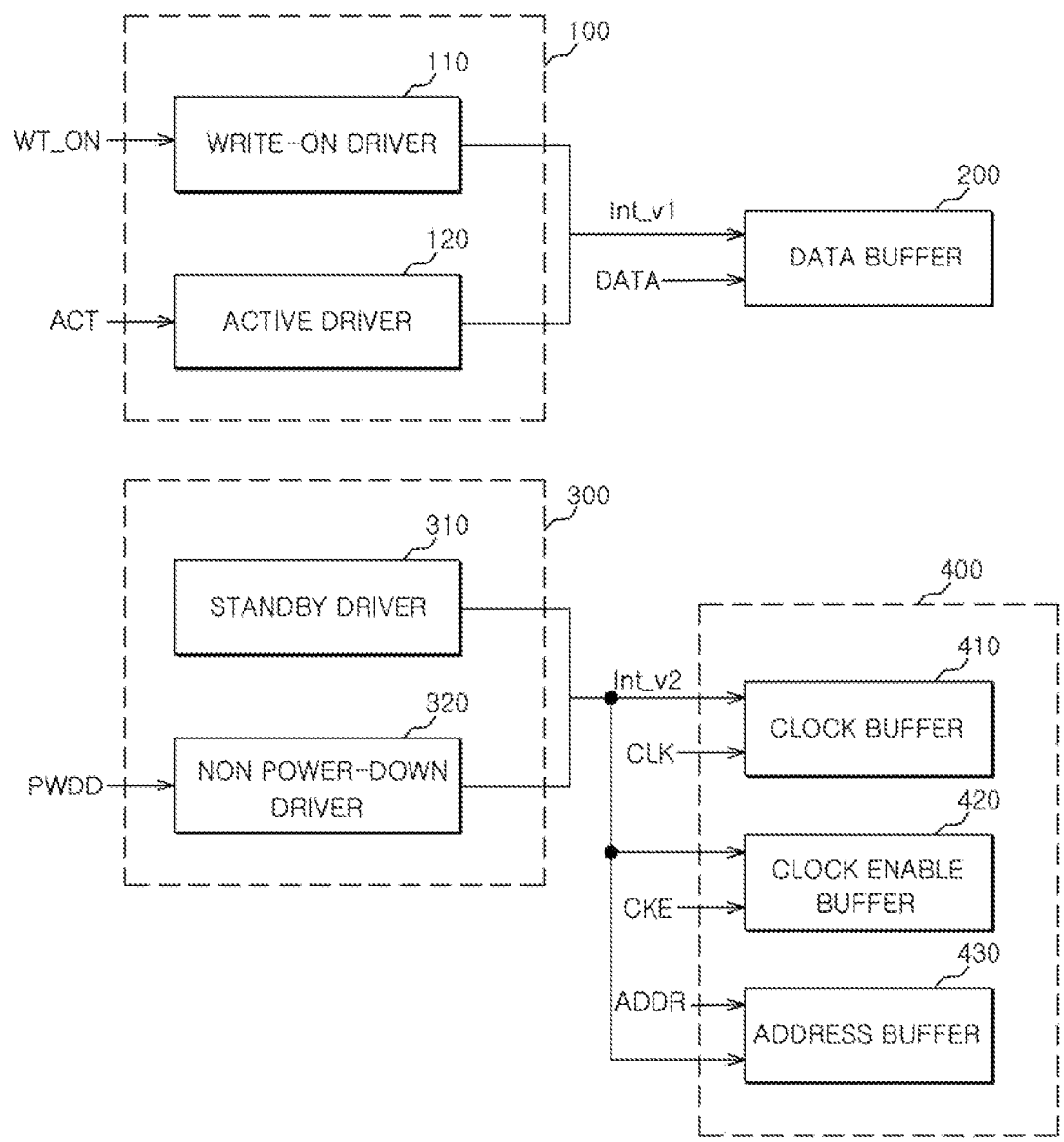
FIG. 4 is a detailed block diagram illustrating the semiconductor integrated circuit in FIG. 3.

FIG. 4 is a diagram illustrating the power supply voltage generating circuit 50 in more detail. Referring to FIG. 4, it can be seen that power supply voltage generating circuit 50 can comprise the first voltage power supply 100, which can include a write-on driver 110 and an active driver 120.

The write-on driver 110 can be configured to generate the first power supply voltage Int_v1 in response to the write enable signal (WT_ON). Depending on the embodiment, the write-on driver 110 can be implemented as a common voltage generating circuit.

Figure 5:
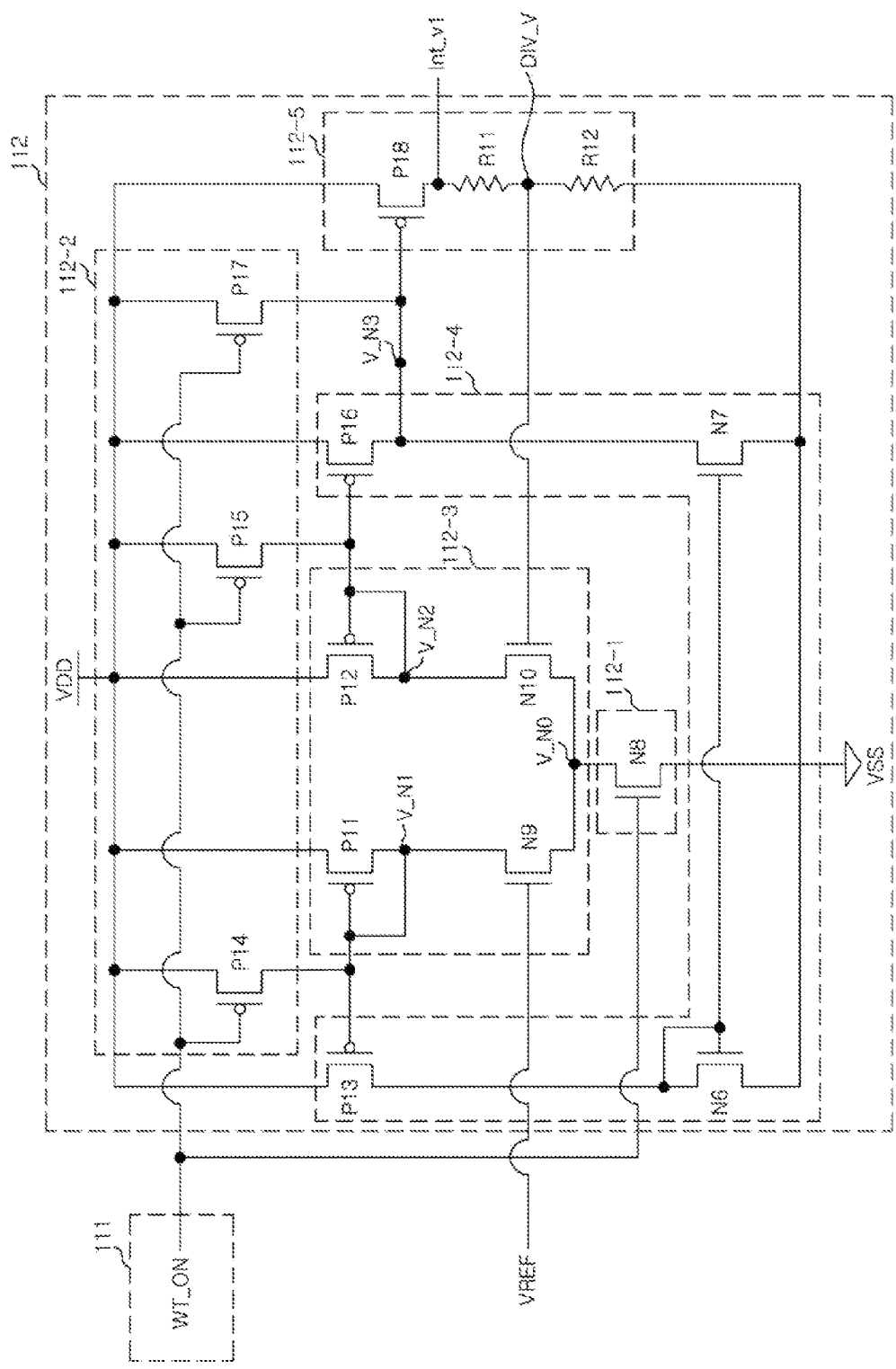
FIG. 5 is a detailed circuit diagram illustrating a write-on driver included in the circuit illustrated in FIG. 4.

Thus, as illustrated in FIG. 5, the write-on driver 110 can include a signal supply unit 111 and a first voltage generating unit 112. The signal supply unit 111 can be configured to supply the write enable signal (WT_ON) to the first voltage generating unit 112. The first voltage generating unit 112 can be configured to down-convert the external supply voltage VDD in response to the write enable signal (WT_ON).

The first voltage generating unit 112 can include a first driving control unit 112-1, a second driving control unit 112-2, a first comparison outputting unit 112-3, a second comparison outputting unit 112-4, and a voltage supply unit 112-5.

The first driving control unit 112-1 includes an eighth MOS transistor N8 driven in response to the write enable signal (WT_ON). The second driving control unit 112-2 includes fourteenth, fifteenth, and seventeenth PMOS transistors P14, P15, and P17 driven in response to the write enable signal (WT_ON).

When the write enable signal (WT_ON) is at a logic high level, the eighth NMOS transistor N8 is turned on so that the first comparison outputting unit 112-3 is driven. In addition, since the fourteenth and fifteenth PMOS transistors P14 and P15 are turned off, the outputs V_N1 and V_N2 of the first comparison outputting unit 112-3 are not pulled to a high level. Since the seventeenth PMOS transistor P17 is turned off, the output V_N3 of the second comparison outputting unit 112-4 is also not pulled to a high level.

The first comparison outputting unit 112-3 receives a reference voltage VREF and a division voltage DIV_V, compares the reference voltage VREF with the division voltage DIV_V, and outputs a comparison result. As can be seen, the first comparison outputting unit 112-3 can include ninth and tenth NMOS transistors N9 and N10 an eleventh PMOS transistor P11, and a twelfth PMOS transistor P12.

When the eighth NMOS transistor N8 of control unit 112-1 is turned on, then the ninth and tenth NMOS transistors N9 and N10 output voltages V_N1 and V_N2 according to the reference voltage VREF and the division voltage DIV_V.

The second comparison outputting unit 112-4 controls the voltage supply unit 112-5 in response to the output of the first comparison outputting unit 112-3. The second comparison outputting unit 112-4 can include sixth and seventh NMOS transistors N6 and N7 and thirteenth and sixteenth PMOS transistors P13 and P16.

The voltage supplying unit 112-5 can include an eighteenth PMOS transistor P18 and resistors R11 and R12. The source of the eighteenth PMOS transistor P18 can be coupled with the external supply voltage VDD and the gate can be coupled with the output V_N3 of the second comparison outputting unit 112-4. The drain of the eighteenth PMOS transistor P18 can be coupled with the voltage dividing resistors R11 and R12. The first power supply voltage Int_v1 can be taken form the nodes connecting the drain of the eighteenth PMOS transistor P18 and resistor R11. The dividing resistors R11 and R12 can then be configured to generate the division voltage DIV_V form the first power supply voltage Int_v1.

The operation of the write-on driver 110 illustrated in FIG. 5 will now be described in detail.

Since the eighth NMOS transistor N8 is turned on as the write enable signal (WT_ON) is activated, the ninth NMOS transistor N9 and the tenth NMOS transistor N10 receive the reference voltage VREF and the division voltage DIV_V.

When the division voltage DIV_V is lower than the reference voltage VREF, the drain voltage V_N1 of the ninth NMOS transistor N9 is at a low level and the drain voltage V_N2 of the tenth NMOS transistor N10 is at a high level.

Therefore, since the drain voltage of the ninth NMOS transistor N9 and the gate voltage of the thirteenth PMOS transistor P13 are at a low level, i.e. V_N1 is low, the thirteenth PMOS transistor P13 and the sixth NMOS transistor N6 are turned on. The seventh NMOS transistor N7 is also turned on so that the drain voltage V_N3 of the seventh NMOS transistor N7 is at a low level. Therefore, the eighteenth PMOS transistor P18 is turned on to supply the external supply voltage VDD to an output terminal as the first power supply voltage Int_v1.

As the first power supply voltage Int_v1 gradually increases and the division voltage DIV_V becomes higher than the reference voltage VREF, the tenth NMOS transistor N10 turns on and pulling the drain voltage V_N3 of the tenth NMOS transistor N10 to a low level. This causes the gate voltage of the sixteenth PMOS transistor P16 to be at a low level, turning the sixteenth PMOS transistor P16 on. This pulls the drain voltage of the sixteenth PMOS transistor P16, which is also the gate voltage V_N3 of the eighteenth PMOS transistor P18 to a high level. This will turn the eighteenth PMOS transistor P18 off so that the external supply voltage VDD is not supplied to the output terminal and the write-on driver 110 does not generate the first power supply voltage Int_v1.

As described above, the write-on driver 110 supplies or blocks the external supply voltage VDD in accordance with the value obtained by comparing the division voltage DIV_V and the reference voltage VREF with each other.

Referring to FIG. 4, the active driver 120 generates the first power supply voltage Int_v1 in response to the active signal (ACT). The active driver 120 can have the same structure as the write-on driver 110. However, the write-on driver 110 is different from the active driver 120 in that the write enable signal (WT_ON) is input as the control signal of the write-on driver 110 and the active signal (ACT) is input as the control signal of the active driver 120. Thus, when the active signal (ACT) is high, then the first power supply voltage Int_v1 will be supplied by the active driver 120 until a division voltage DIV_V exceeds a reference voltage VREF.

In a semiconductor integrated circuit having a write latency scheme, such as a DDR SDRAM, the data buffer 200 can be turned on during the write operation. Therefore, it is sufficient to include only the write-on driver 110 to drive the data buffer 200 in a DDR SDRAM. As a result, the first power supply voltage Int_v1 can be generated by the write-on driver 110 for driving the data buffer 200.

However, in a semiconductor integrated circuit that does not have a write latency scheme, such as the SDR SDRAM, the data buffer 200 must be turned on before the write operation. Therefore, in a SDR SDRAM an active driver 120 can be included along with the write-on driver 110 so that the first power supply voltage Int_v1 can be supplied before the write-on driver 110 is driven.

Therefore, excessive power consumption can be avoided by selectively driving the write-on driver 110 and the active driver 120 only when the data buffer 200 is required to be turned on, which reduced current consumption.

Referring again to FIG. 4, the second voltage power supply 300 generates the second power supply voltage Int_v2 in response to a power-down mode signal (PWDD). As can be seen, the second voltage power supply 300 can include a non power-down driver 320 and a standby driver 310.

The non power-down driver 320 can be configured such that it is always driven to supply the second power supply voltage Int_v2, except in the power-down mode. The standby driver 310, on the other hand, is always driven to supply the second power supply voltage Int_v2. This is because the clock buffer 410 and the address buffer 420 of the input buffer 400 are always turned on, except in the power-down mode, while the clock enable buffer 430 of the input buffer 400 is always turned on.

The standby driver 310 can be realized by a common voltage generating circuit. The non power-down driver 320, on the other hand, generates the second power supply voltage Int_v2 in response to the power-down mode signal (PWDD).

Figure 6:
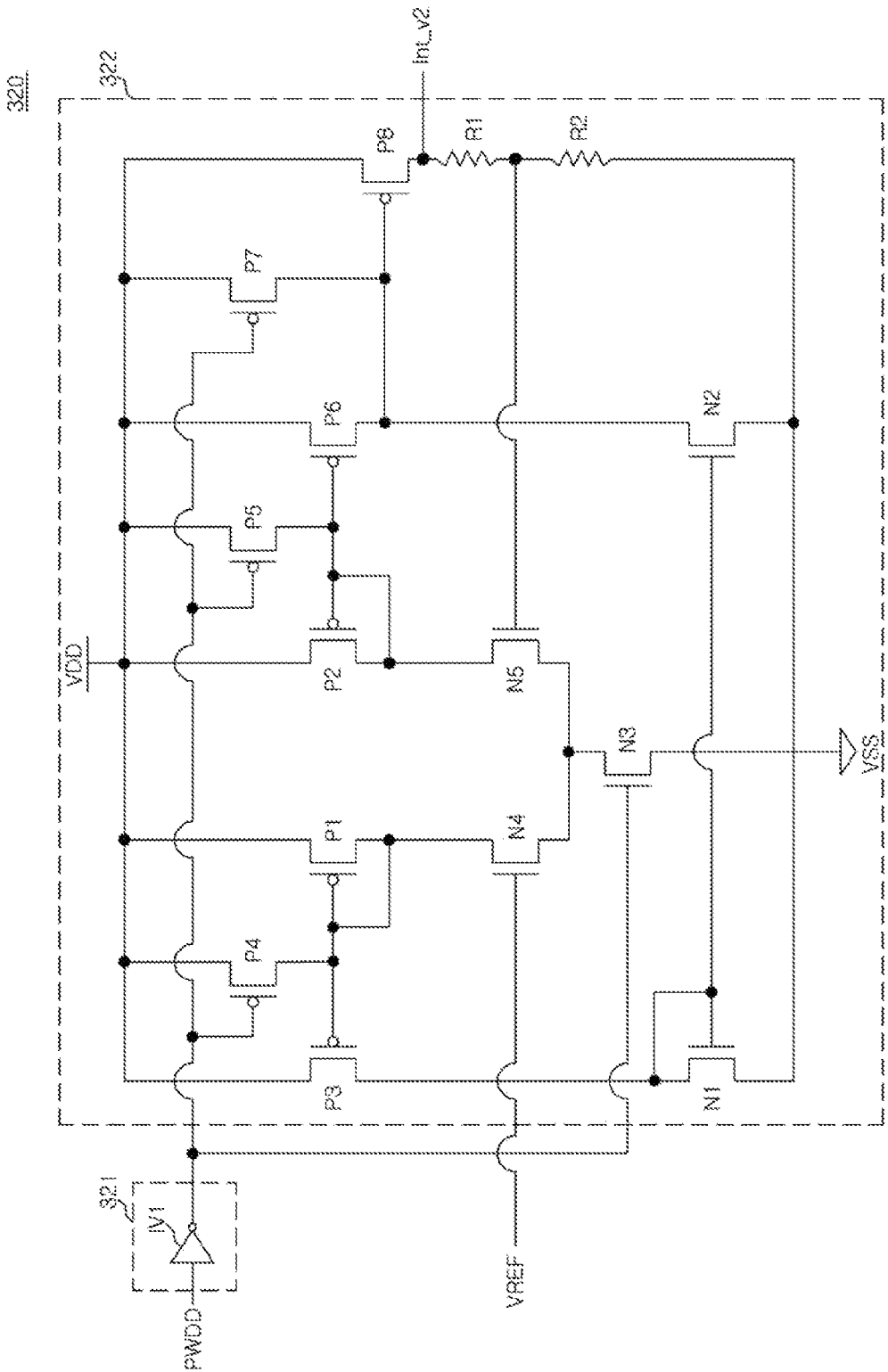
FIG. 6 is a detailed circuit diagram illustrating a non power-down driver included in the circuit illustrated in FIG. 4.

FIG. 6 is a circuit diagram illustrating one example implementation of the non power-down driver 320. Referring to FIG. 6, the non power-down driver 320 can include a control unit 321 and a voltage generating unit 322. The control unit 321 can include an odd inverter IV1 for buffering the power-down mode signal (PWDD). The voltage generating unit 322 can be configured to generate the second power supply voltage Int_v2 in response to the output of the control unit 321.

The voltage generating unit 322 can be realized by a common internal voltage generating circuit for down-converting the external supply voltage VDD.

Referring again to FIG. 4, the input buffer 400 represent all the buffers excluding the data buffer 200 that receives the second power supply voltage Int_v2. The input buffer 400 can include, for example, the clock buffer 410, the clock enable buffer 420, and the address buffer 430.

The clock buffer 410 can be configured to receive a clock signal (CLK) to buffer the clock signal (CLK). The clock enable buffer 420 receives a clock enable signal (CKE) to buffer the clock enable signal (CKE). The address buffer 430 receives an address signal (ADDR) to buffer the address signal (ADDR).

Figure 7:
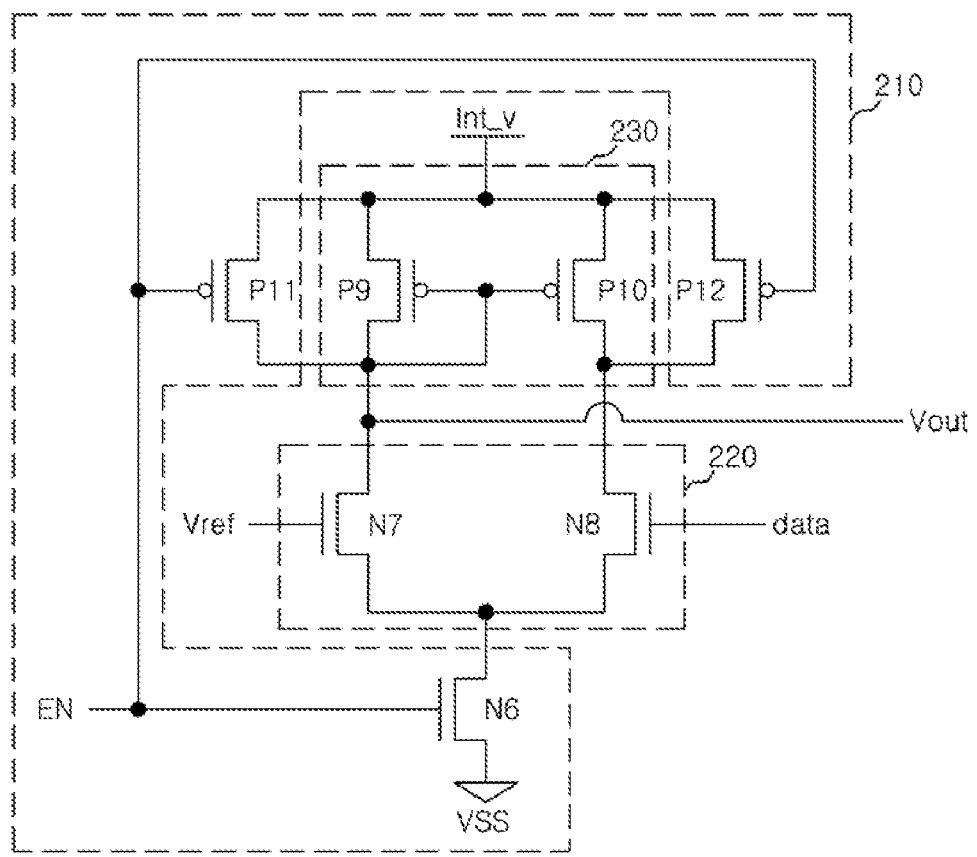
FIG. 7 is a detailed circuit diagram illustrating a data buffer included in the circuit illustrated in FIG. 3.

The data buffer 200, on the other hand, receives the first power supply voltage Int_v1 to buffer input data signal (DATA). FIG. 7 is a circuit diagram illustrating an example implementation of the data buffer 200. Referring to FIG. 7, the data buffer 200 can include a driving unit 210, a sensing unit 220, and a current mirror unit 230.

The driving unit 210 can include a sixth NMOS transistor N6, an eleventh PMOS transistor P11, and a twelfth PMOS transistor P12 driven in accordance with an enable signal (EN).

The sensing unit 220 can include seventh and eighth NMOS transistors N7 and N8 that receive the reference voltage VREF and the data signal (DATA) and compares the reference voltage VREF and the data signal (DATA) and outputs the comparison result. The comparison is performed to sense whether the input data signal (DATA) is at a high or low level.

The current mirror unit 230 includes ninth and tenth PMOS transistors P9 and P10 for supplying current from the power supply voltage Int_v.

The operation of the data buffer 200 illustrated in FIG. 4 is as follows: When the enable signal (EN) is activated, the sixth NMOS transistor N6 is turned on and the eleventh PMOS transistor P11 and the twelfth PMOS transistor P12 are turned off. When the reference voltage VREF and the data signal (DATA) are compared with each and it is determined that the level of the data signal (DATA) is lower than the level of the reference voltage VREF, then the drain node voltage Vout of the seventh NMOS transistor N7 is at a low level and the voltage of the drain node of the eighth NMOS transistor N8 is at a high level. Therefore, the output voltage Vout is at a low level.

When the level of the data signal (DATA) is higher than the level of the reference voltage VREF, the voltage of the drain node of the eighth NMOS transistor N8 is at a low level and the voltage of the drain node of the seventh NMOS transistor N7 is at a high level. Therefore, the output voltage Vout is at a high level. Therefore, the data buffer 200 buffers the signal level of the data signal (DATA) and outputs the power supply voltage Int_v level of the buffer.

The sources by which the first power supply voltage Int_v1 is generated are the active driver 120 and the write-on driver 110, and the sources by which the second power supply voltage Int_v2 is generated are the standby driver 310 and the non power-down driver 320. However, the level of the first power supply voltage Int_v1 can be the same as the level of the second power supply voltage Int_v2. Therefore, the levels of the voltages supplied to the buffers that receive the first power supply voltage Int_v1 and the second power supply voltage Int_v2 can also be the same.

The operation of the semiconductor integrated circuit according to the present invention illustrated in FIGS. 3 to 7 will be described as follows.

For example, in the case of the DDR SDRAM, in the write operation, the write enable signal (WT_ON) is enabled. Therefore, the write-on driver 110 is activated to generate the first power supply voltage Int_v1. Therefore, the data buffer 200 receives the first power supply voltage Int_v1 generated by the write-on driver 110 during a write operation. In the case of the DDR SDRAM, since the data buffer is turned on only in the write operation due to the presence of the write latency, the data buffer can be driven only by the write-on driver 110 without including the active driver 120.

In the case of the SDR SDRAM, since the data buffer 200 is turned on in the active operation before the write operation is performed, the active driver 120 must be provided, or operational. Therefore, when the active signal (ACT) is enabled, the active driver 120 is driven and the first power supply voltage Int_v1 is generated to be supplied to the data buffer 200. Then, in the write operation, the write-on driver 110 is driven as the write enable signal (WT_ON) is activated to generate the first power supply voltage Int_v1 and to supply the generated first power supply voltage Int_v1 to the data buffer 200. Therefore, since the write-on driver 110 and the active driver 120 are driven in accordance with the operational timing of the data buffer 200, the current consumption can be reduced.

The standby driver 310 is always driven to supply the second power supply voltage Int_v2 to the input buffer 400.

The non power-down driver 320 is driven in the non power-down mode to generate the second power supply voltage Int_v2. Therefore, since the standby driver 310 and the non power-down driver 320 are driven in accordance with operational timing of the input buffer 400, the current consumption can be modulated effectively.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor integrated circuit, comprising:
   a first buffer and a second buffer having different operation timings;
   a first voltage power supply for generating a first power supply voltage supplied to the first buffer in accordance with the operation timing of the first buffer; and
   a second voltage power supply for generating a second power supply voltage supplied to the second buffer in accordance with the operation timing of the second buffer,
   wherein the operational timings of the first and second buffers are different from each other, and the first voltage power supply is a write-on driver for generating the first power supply voltage in response to a write enable signal.

2. The semiconductor integrated circuit of claim 1, wherein the write-on driver includes a voltage generating unit for down-converting an external supply voltage in response to the write enable signal to output the first power supply voltage.

3. The semiconductor integrated circuit of claim 1, wherein the first voltage power supply includes an active driver for generating the first power supply voltage in response to an active signal.

4. The semiconductor integrated circuit of claim 3, wherein the active driver includes a voltage generating unit for down-converting the external supply voltage in response to the active signal to output the first power supply voltage.

5. The semiconductor integrated circuit of claim 1, wherein the second voltage power supply is a non power-down driver for generating the second voltage power supply in response to a power-down mode signal.

6. The semiconductor integrated circuit of claim 5, wherein the non power-down driver is driven when the power-down mode signal is disabled.

7. The semiconductor integrated circuit of claim 6, wherein the non power-down driver comprises:
- a first control unit having odd inverters that receive the power-down mode signal; and
- a voltage generating unit for down-converting the external supply voltage in response to an output of the first control unit to output the second power supply voltage.

8. The semiconductor integrated circuit of claim 7, wherein the voltage generating unit includes:
- a first driving control unit for driving the voltage generating unit in response to the output of the first control unit;
- a second driving control unit for fixing an output of the voltage generating unit in response to the output of the first control unit;
- a first comparison outputting unit for comparing a reference voltage and a division voltage obtained by dividing the first power supply voltage with each other in response to the output of the first driving control unit to output a comparison result;
- a second comparison output unit for controlling a voltage control unit in response to the output of the first comparison outputting unit; and
- a voltage supply unit for supplying the external supply voltage to an output terminal in response to the output of the second comparison outputting unit.

9. The semiconductor integrated circuit of claim 6, wherein the second voltage power supply includes a standby driver which is always driven in order to generate the second power supply voltage.

10. The semiconductor integrated circuit of claim 8, wherein the standby driver includes a voltage generating unit for down-converting an external supply voltage to output the second power supply voltage.

11. The semiconductor integrated circuit of claim 1, wherein the second power supply voltage has the same level as the first power source voltage.

12. The semiconductor integrated circuit of claim 1, wherein the first buffer is a data buffer that receives the first power supply voltage to buffer input data.

13. The semiconductor integrated circuit of claim 12, wherein the data buffer is driven during a write operation.

14. The semiconductor integrated circuit of claim 1, wherein the second buffer is an input buffer that receives the second power supply voltage to buffer an input signal.

15. The semiconductor integrated circuit of claim 14, wherein the input signal is a clock signal, a clock enable signal, or an address signal.

16. A semiconductor integrated circuit, comprising:
- a data buffer configured to buffer input data;
- a write-on driver configured to drive the data buffer by generating a first power supply voltage when a write enable signal is enabled, and not to drive the data buffer by not generating the first power supply voltage when the write enable signal is disabled; and
- an active driver for generating the first power supply voltage in response to an active signal.

17. The semiconductor integrated circuit of claim 16, further comprising:
- a standby driver driven during an operation of the semiconductor integrated circuit in order to generate a second power supply voltage; and
- an input buffer that receives the second power supply voltage.

18. The semiconductor integrated circuit of claim 16, further comprising:
- a standby driver driven during an operation of the semiconductor integrated circuit in order to generate a second power supply voltage; and
- an input buffer that receives the second power supply voltage.

19. The semiconductor integrated circuit of claim 16, further comprising a non power-down driver for generating the second power supply voltage in response to a power-down mode signal.

20. The semiconductor integrated circuit of claim 18 further comprising the non power-down driver for generating the second power supply voltage in response to a power-down mode signal.

* * * * *